United States Patent [19]

Harada

[11] Patent Number: 5,218,236
[45] Date of Patent: Jun. 8, 1993

[54] OUTPUT CIRCUIT HAVING AN INTEGRATED CIRCUIT WITH A PLURALITY OF OUTPUT TRANSISTORS CONNECTED TO AN EXTERNAL ELEMENTS

[75] Inventor: Takashi Harada, Hekinan, Japan

[73] Assignee: Nippondenso Co., Ltd., Kariya, Japan

[21] Appl. No.: 772,857

[22] Filed: Oct. 8, 1991

[30] Foreign Application Priority Data

Oct. 10, 1990 [JP] Japan ................... 2-273041

[51] Int. Cl.$^5$ .................. H03K 17/60; H03K 3/26; H03K 3/01; H01L 25/00
[52] U.S. Cl. ............................ 307/255; 307/296.6; 307/303.1; 307/313; 307/315; 307/241
[58] Field of Search ............ 307/255, 159, 315, 317.1, 307/296.6, 303, 303.1, 313, 241

[56] References Cited

U.S. PATENT DOCUMENTS

| | | | |
|---|---|---|---|
| 4,194,134 | 3/1980 | Bjorklund et al. | 307/255 |
| 4,242,728 | 12/1980 | Hartford | 364/431.09 |
| 4,242,729 | 12/1980 | Weber et al. | 364/431.12 |
| 4,244,023 | 1/1981 | Johnson | 364/431.07 |
| 4,244,050 | 1/1981 | Weber et al. | 364/431.11 |
| 4,245,312 | 1/1981 | de Vulpillieres | 364/431.06 |
| 4,245,314 | 1/1981 | Henrich et al. | 364/431.11 |
| 4,245,315 | 1/1981 | Barman et al. | 364/431.06 |
| 4,255,789 | 3/1981 | Hartford et al. | 364/431.06 |
| 4,257,034 | 3/1981 | Wilkinson | 364/431.12 |
| 4,263,652 | 4/1981 | Henrich | 364/431.06 |
| 4,264,898 | 4/1981 | Barman et al. | 364/431.12 |
| 4,266,274 | 5/1981 | Barman | 364/431.12 |
| 4,276,600 | 6/1981 | Hartford et al. | 364/431.06 |
| 4,605,870 | 8/1986 | Dansky et al. | 307/443 |
| 4,639,755 | 1/1987 | Namiki et al. | 307/317.1 |
| 4,665,459 | 5/1987 | Bynum et al. | 307/255 |
| 4,847,515 | 7/1989 | Nakach et al. | 307/255 |
| 4,924,341 | 5/1990 | Culp et al. | 307/255 |

FOREIGN PATENT DOCUMENTS

0076099 4/1983 European Pat. Off. .
3230236 2/1984 Fed. Rep. of Germany .
133653 7/1989 Japan .

OTHER PUBLICATIONS

P. Horowitz et al., "The Art of Electronics", 1980, Cambridge University Press, New York, U.S.A., p. 78.

Primary Examiner—William L. Sikes
Assistant Examiner—Trong Quang Phan
Attorney, Agent, or Firm—Cushman, Darby & Cushman

[57] ABSTRACT

An output circuit which is provided with an integrated circuit composed of a PNP transistor and an NPN transistor of which the base is connected to the collector of the PNP transistor, a voltage source for supplying an electric potential to the emitter of the PNP transistor and voltage dropping means provided outside the integrated circuit for making the electric potential supplied to the collector of the NPN transistor less than the electric potential of the voltage source. Thereby, an electric potential supplied to the NPN transistor can be decreased because a voltage drop is caused by an element provided outside the integrated circuit. Thus, power consumption in the NPN transistor can be decreased. Namely, power consumed in the integrated circuit can be reduced. Consequently, high packaging density of the integrated circuit can be achieved and provision of multiple channels in the integrated circuit can be realized.

14 Claims, 5 Drawing Sheets

OUTPUT CIRCUIT HAVING AN INTEGRATED CIRCUIT WITH A PLURALITY OF OUTPUT TRANSISTORS CONNECTED TO AN EXTERNAL ELEMENTS

BACKGROUND OF THE INVENTION

1. Field of the Invention

This invention generally relates to an output circuit including an integrated circuit and more particularly to an output circuit including an integrated circuit, the high integration of which is realized by reducing power consumption thereof.

2. Description of the Related Art

A conventional output portion of an integrated circuit 1 is provided with a driving circuit which is composed of a PNP transistor 101 and an NPN transistor 102 as illustrated in FIG. 8 and drives the integrated circuit by supplying electric current from a positive electrode $V_o$ of a power source. An example of such a conventional output portion or circuit is disclosed in Japanese Patent Application Publication No. 1-33653 Official Gazette.

However, in case of the conventional output circuit provided with such a driving circuit consisting of the PNP transistor 101 and the NPN transistor 102, the emitter of the PNP transistor 101 is connected to the collector of the NPN transistor 102 and moreover the collector of the PNP transistor 101 is connected to the base of the NPN transistor 102 in the integrated circuit 1. Thus, in case where a large amount of electric current is supplied thereto, there is large power consumption in the NPN transistor 102. Consequently, the conventional output portion has a drawback that integration of multiple channels is restricted by heat radiation and power consumption depending on a package of an integrated circuit (IC), namely, that the number of channels cannot be increased in case of integration of multiple channels. The present invention is created to eliminate the above described drawback of the conventional output circuit of an integrated circuit.

It is, therefore, an object of the present invention to provide an output circuit of an IC which can reduce power consumed in the IC and achieve high packaging density of the IC and realize provision of multiple channels therein.

SUMMARY OF THE INVENTION

To achieve the foregoing object and in accordance with an aspect of the present invention, there is provided an output circuit comprising an integrated circuit composed of a PNP transistor and an NPN transistor of which the base is connected to the collector of the PNP transistor, a voltage source for supplying an electric potential to the emitter of the PNP transistor and voltage dropping means provided outside the integrated circuit for making the electric potential supplied to the collector of the NPN transistor less than the electric potential of the voltage source.

Thereby, when the PNP transistor is turned on, a collector current of the PNP transistor flows into the base of the NPN transistor and thus the NPN transistor turns on. At that time, a voltage applied to the NPN transistor is made by the voltage dropping means provided outside the integrated circuit to be less than a source voltage. Further, power consumption in the NPN transistor is reduced by an amount of power consumption in this voltage dropping means. Consequently, power consumed in the integrated circuit becomes decreased.

By employing the output circuit including the integrated circuit having the driving circuit composed of the combination of the PNP transistor and the NPN transistor according to the present invention, an electric potential supplied to the NPN transistor can be decreased because a voltage drop is caused by an element provided outside the integrated circuit. Thus, power consumption in the NPN transistor can be decreased. Namely, power consumed in the integrated circuit can be reduced. Each of these elements, which cause a voltage drop, can be connected to several driving circuits. Consequently, high packaging density of the integrated circuit (IC) can be achieved and provision of multiple channels in the IC can be realized.

BRIEF DESCRIPTION OF THE DRAWINGS

Other features, objects and advantages of the present invention will become apparent from the following description of preferred embodiments with reference to the drawings in which like reference characters designate like or corresponding parts throughout several views, and in which.

DETAILED DESCRIPTION OF THE PREFERRED EMBODIMENTS

Hereinafter, preferred embodiments of the present invention will be described in detail by referring to the accompanying drawings.

Figure 1:
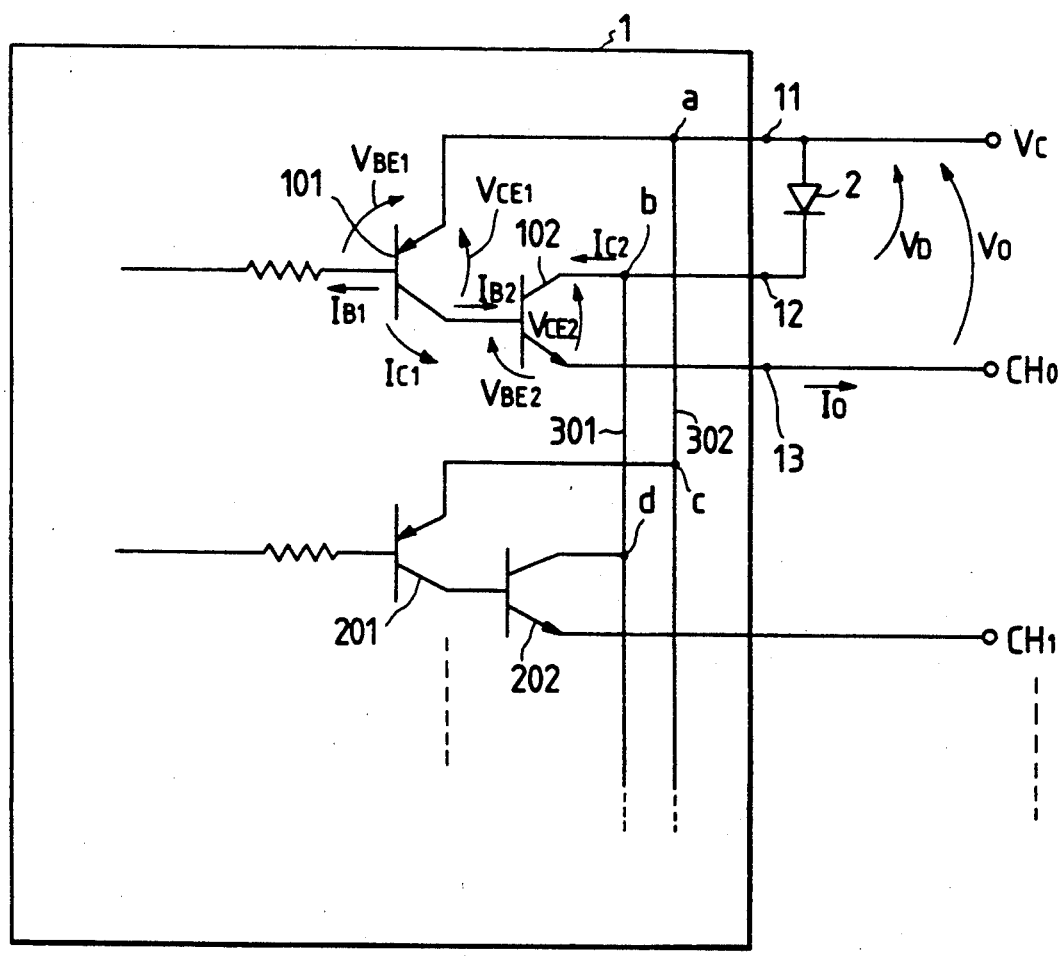
FIG. 1 is a circuit diagram for showing the construction of a primary part of an embodiment of the present invention.

FIG. 1 is a circuit diagram for showing the construction of a primary part of an embodiment of the present invention. In this figure, reference numeral 1 designates an integrated circuit (IC); 101 a first PNP transistor incorporated in the IC 1; and 102 a first NPN transistor incorporated in the IC 1. The transistors 101 and 102 compose a first circuit which is a driving circuit. The transistor 101 is of a PNP type and on the other hand the transistor 102 is of an NPN type. A power source $V_o$ is connected to a terminal 11, so that power is supplied to an emitter terminal a of the transistor 101. Further, a diode 2 serving as a voltage dropping means is provided outside the IC 1 and between the terminal 11 and a terminal 12. Power is supplied to a collector terminal b of the transistor 102 through the diode 2. A terminal 13 is an output terminal from which a signal corresponding to a code to be inputted to the base of the transistor 101 is outputted.

Reference numeral 201 designates a second PNP transistor which is a transistor of the PNP type; and 202 a second NPN transistor which is a transistor of the NPN type.

These transistors 201 and 202 compose a second circuit which is another driving circuit. Reference circuit c denotes an emitter terminal of the transistor 201, which is connected to the emitter terminal a of the transistor 101 by a first conductor formed by an emitter common line 302. Moreover, reference character d denotes a collector terminal of the transistor 202, which is connected to the collector terminal b of the transistor 102 by a second conductor formed by a collector common line 301.

Reference characters $I_{C1}$, $I_{B1}$, $V_{BE1}$ and $V_{CE1}$ represent a collector current, a base current, a base-emitter voltage (namely, a voltage between the base and the emitter) and a collector-emitter voltage (namely, a voltage between the collector and the emitter) of the transistor 101, respectively. Further, reference characters $I_{C2}$, $I_{BE2}$, $V_{BE2}$ and $V_{CE2}$ represent a collector current, a base current, a base-emitter voltage and a collector-emitter voltage of the transistor 102, respectively. Reference character $V_D$ designates a voltage drop in the diode 2; $V_O$ an output drop between the output terminal 13 and the power source $V_O$; and $I_O$ an output current drawn from the output terminal 13.

Hereinafter, power consumed inside and outside the IC 1 will be described.

First, consider a case where the driving circuits are turned on.

The output voltage drop $V_O$ depends on the relation between a sum of $V_{CE1}$ and $V_{BE2}$ and a sum of a forward voltage $V_D$ of the diode 2 and $V_{CE2}$. That is, on an operating condition that these sums are equal to each other, namely, $$V_{CE1}+V_{BE2}=V_D+V_{CE2},$$

the sum ($V_{CE1}+V_{BE2}$) or ($V_D+V_{CE2}$) becomes the output voltage drop $V_O$.

Here, consider a case where $I_0=100$ milli-amperes (mA) and $I_{B1}=0.2$ mA, for instance.

Figure 2:
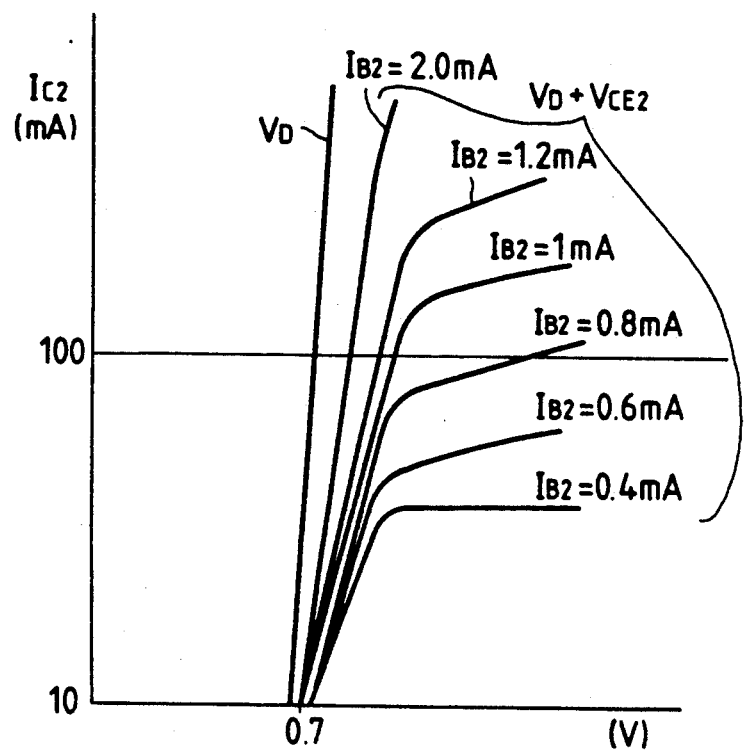
FIGS. 2 and 3 are graphs for illustrating characteristics of the circuit of FIG. 1.

FIG. 2 is a graph showing the relation between the collector current $I_{C2}$ and the output voltage drop $V_O$ of the transistor 102 under the condition that the base current $I_{B2}$ of the transistor 102 is constant.

As is seen from this figure, the forward voltage $V_D$ of the transistor 102 increases a little in the vicinity of 0.7 volts (V) as the collector current $I_{C2}$ increases. Further, $V_{CE2}$ varies with $I_{C2}$ which is saturated correspondingly to $I_{B2}$. Here, note that when the transistor 102 is turned on, $I_O$ is approximately equal to $I_{C2}$, namely, $$I_O \approx I_{C2}.$$

Figure 3:
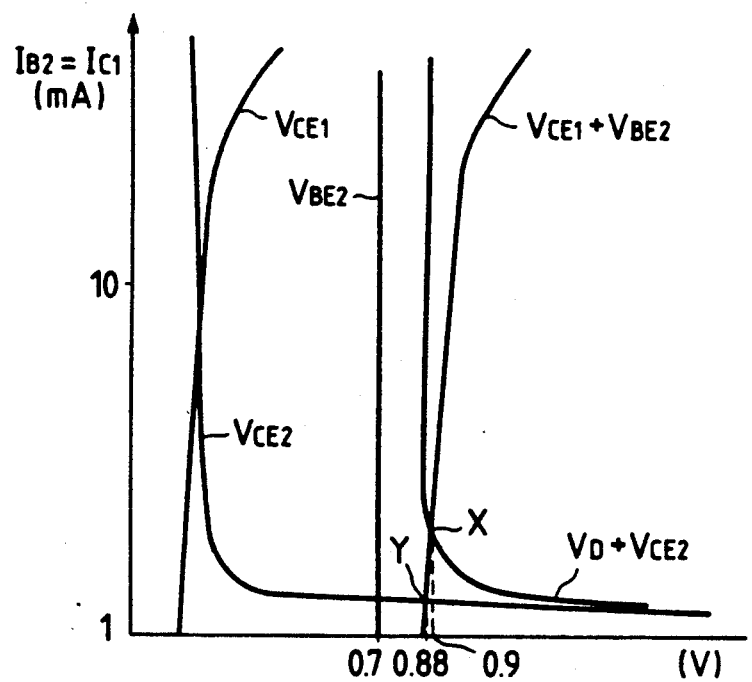

Thus, in case where $I_{C2}=100$ mA, the relation between the sum ($V_D+V_{CE2}$) and the base current $I_{B2}$ becomes as indicated by a curve "$V_D+V_{CE2}$" of FIG. 3. Moreover, as shown in FIG. 3, $V_{BE2}$ becomes nearly equal to 0.7 V in case where $I_{C2}=100$ mA. Furthermore, in case where $I_{B1}=0.2$ mA, $V_{CE1}$ increases with increase of $I_{C1}$. As indicated by a characteristic curve "$V_{BE2}+V_{CE1}$" of FIG. 3, the value of the sum ($V_{BE2}+V_{CE1}$) increases a little as the collector current $I_{C1}$ increases.

Here, note that $I_{B2}=I_{C1}$. Therefore, the point X of intersection of the curves "$V_{CE1}+V_{BE2}$" and "$V_D+V_{CE2}$" indicates the output voltage drop $V_O$. In this example, $V_O \approx 0.9$ V.

Power $P_W$ consumed in the transistors 101 and 102 is represented by the following equation:

$$P_W=I_{B1}\times V_{BE1}+I_{C1}\times(V_{CE1}+V_{BE2})+I_{C2}\times V_{CE2} \quad (1)$$

Here, note that $V_{CE1}+V_{BE2}=V_D+V_{CE2}=V_O$ as described above. Thus, the equation (1) can be rewritten as the following equation:

$$P_W=I_{B1}\times V_{BE1}+I_{C1}\times V_O+I_{C2}\times(V_O-V_D) \quad (2)$$

Further note that $$I_O \approx I_{C2} > I_{C1} > I_{B1} \quad (3)$$

Thus, the equation (2) is rewritten as follows:

$$P_W \approx I_O \times (V_O - V_D) \quad (4)$$

By substituting the values 100 mA, 0.9 V and 0.7 V for $I_O$, $V_O$ and $V_D$, respectively, in this equation, we have $P_W=0.02$ watts (W).

Next, for comparison with this, power consumed in the conventional output circuit of FIG. 8 which is not provided with a diode is evaluated as follows.

The output voltage drop $V_{O1}$ is indicated by the point Y of intersection of the curves "$V_{CE2}$" and "$V_{CE1}+V_{BE2}$" of FIG. 3. In this example, $V_{O1}=0.88$ V. Power consumption $P_{WO}$ in this case is represented by the following equation:

$$P_{WO}=I_{B1}\times V_{BE1}+I_{C1}(V_{CE1}+V_{BE2})+I_{C2}\times V_{CE2} \quad (5)$$

Here, note $$V_{O1}=V_{CE1}+V_{BE2}=V_{CE2} \quad (6)$$

Thus, the equation (5) is rewritten as the following equation:

$$P_{WO}=I_{B1}\times V_{BE1}+I_{C1}\times V_{O1}+I_{C2}\times V_{O1} \quad (7)$$

Further, note $I_O \approx I_{C2} > I_{C1} > I_{B1}$. Consequently, the consumed power $P_{WO}$ can be represented by the following approximate expression:

$$P_{WO} \approx I_O \times V_{O1} \quad (8)$$

By substituting the values 100 mA and 0.88 V for $I_O$ and $V_{O1}$, respectively, in this expression, we have $P_{WO} \approx 0.088$ W.

Figure 8:
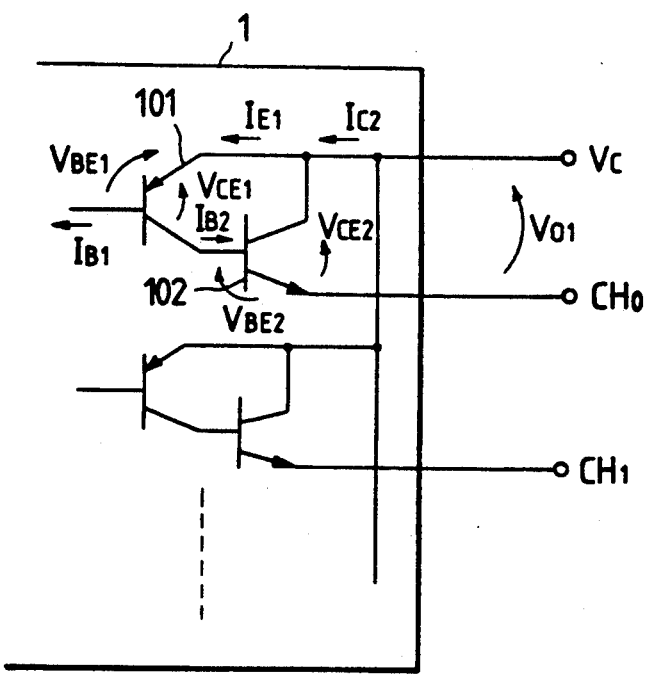
FIG. 8 is a circuit diagram for illustrating a conventional circuit.

As described above, power consumed in inner elements of an IC can be reduced from 0.088 W to 0.02 W per driving circuit thereof by adding the diode 2 thereto.

this means that if the rated power consumption of an IC in a package is, for example, 0.5 W, an IC of the present invention can incorporate 25 circuits because $0.5\text{ W} \div 0.02\text{ W} = 25$ in contrast to the fact that the conventional IC of FIG. 8 can only incorporate 5 circuits because $0.5\text{ W} \div 0.088\text{ W} \approx 5$.

As described above, in case of this embodiment, power consumed in the inside of an IC can be substantially reduced by transferring most of power consumed in the conventional IC to an outside diode. Thereby, extra-high packaging density of the IC can be achieved.

Figure 4:
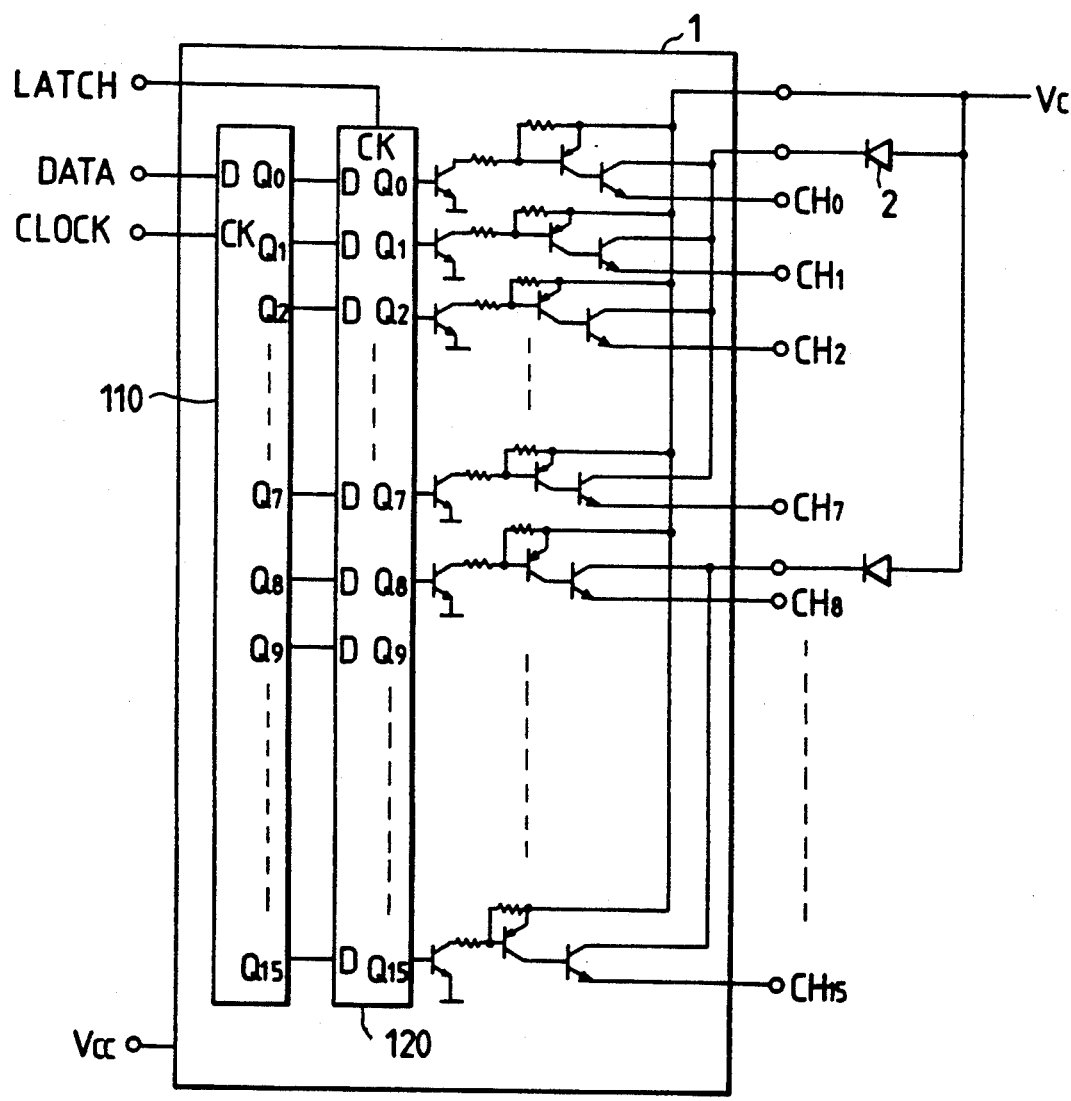
FIG. 4 is a circuit diagram for showing an integrated circuit including 16 channels and employing the circuit of FIG. 1.

FIG. 4 is schematic circuit diagram of an output circuit of an IC employing the circuit of FIG. 1. This IC employs an IC package which has pins respectively corresponding to 16 channels CH0~CH15 and totally has 24 pins.

Serial input data respectively corresponding to 16 channels are respectively transferred to a shift register 110 in synchronization with a clock frequency. Upon completion of the transfer, the input data are stored in a latch circuit 120.

In this embodiment, a diode provided outside the IC 1 for serving as a voltage dropping means is used for every eight channels in view of power consumption thereof. Therefore, a total of two diodes are used in this embodiment.

Further, circuits such as an injector driving circuit, an idling-speed-control (ISC) valve driving circuit or the like are connected to the pins respectively corresponding to the channels CH0~CH15. These circuits are driven in accordance with serial data inputted to the IC1.

In case of the above-described embodiment, reduction in power consumed in an IC is intended by transferring part of power consumed in the inside of the IC to a diode which is an external element. Instead of a diode, a resistance or a transistor may be employed as such an external element.

Figure 5:
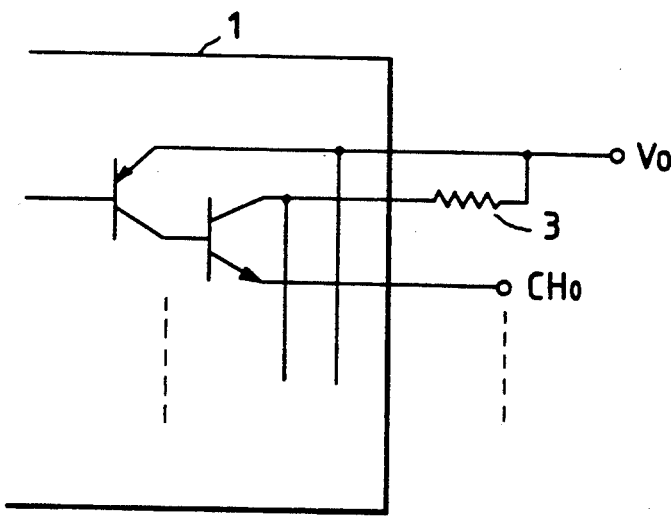
FIG. 5 is a circuit diagram for showing the construction of a primary part of another embodiment of the present invention employing a resistance.

FIG. 5 is a schematic circuit diagram of a output circuit of an IC employing a resistor as an external element. In case of this circuit, it is necessary to select a value of the resistance of the resistor 3 such that a voltage drop across the resistor 3 becomes within the range of from 0.5 to 0.9 V.

Figure 6:
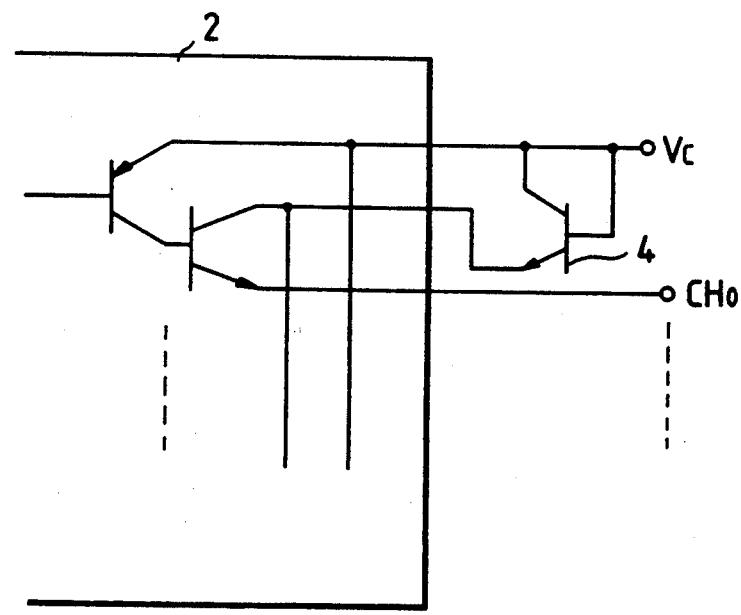
FIG. 6 is a circuit diagram for showing the construction of a primary part of further another embodiment of the present invention employing a transistor.

Further, FIG. 6 is a schematic circuit diagram of an output circuit of an IC employing a transistor as an external element. In case of this circuit, it is necessary to select a transistor 4 such that the collector-emitter voltage of the transistor 4 becomes within the range of from 0.5 to 0.9 V.

Figure 7:
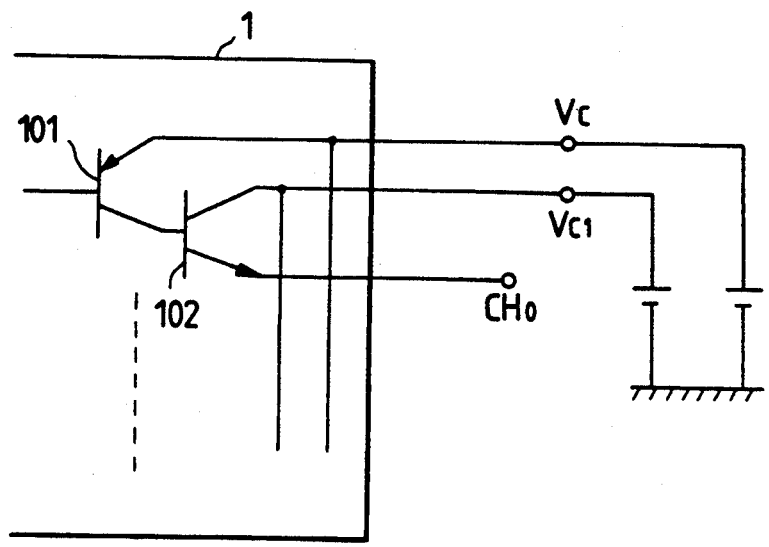
FIG. 7 is a circuit diagram for showing the construction of a primary part of still another embodiment of the present invention employing a voltage source.

Alternatively, two power source systems may be provided for the IC as illustrated in FIG. 7 such that the difference in electric potential between the voltage ($V_c$) supplied to the emitter of the transistor 101 and that ($V_{c1}$) supplied to the collector of the transistor 102 becomes within the range of from 0.5 to 0.9 V.

While preferred embodiments of the present invention have been described above, it is to be understood that the present invention is not limited thereto and that other modifications will be apparent to those skilled in the art without departing from the spirit of the invention. The scope of the present invention, therefore, is to be determined solely by the appended claims.

What is claimed is:

1. An output circuit comprising:
   an integrated circuit including a first circuit, which has a collector of a first PNP transistor connected to a base of a first NPN transistor, and a second circuit, which has a collector of a second PNP transistor connected to a base of a second NPN transistor;
   a first external terminal on said integrated circuit, to which a voltage source can be connected, coupled to an emitter of said first PNP transistor and to an emitter of said second PNP transistor;
   a second external terminal on said integrated circuit which is connected to a collector of said first NPN transistor and to a collector of said second NPN transistor;
   a first input signal terminal on said integrated circuit which is connected to a base of said first PNP transistor;
   a second input signal terminal on said integrated circuit which is connected to a base of said second PNP transistor;
   a first output signal terminal on said integrated circuit which is connected to an emitter of said first NPN transistor;
   a second output signal terminal on said integrated circuit which is connected to an emitter of said second NPN transistor; and
   voltage dropping means, provided outside said integrated circuit and coupling said first and second external terminals, for providing an electric potential to said second external terminal which is less than that provided to said first external terminal.

2. The output circuit as set forth in claim 1, wherein said voltage dropping means comprises a diode which has an anode connected to said first external terminal and a cathode connected to said second external terminal.

3. The output circuit as set forth in claim 1, wherein said voltage dropping means comprises a resistor which has a first end connected to said first external terminal and a second end connected to said second external terminal.

4. The output circuit as set forth in claim 1, wherein said voltage dropping means comprises a transistor which has a collector and a base connected to said first external terminal and an emitter connected to said second external terminal.

5. The output circuit as set forth in claim 1, wherein said integrated circuit comprises a third circuit, which has a collector of a third PNP transistor connected to a base of a third NPN transistor, said first external terminal is connected to an emitter of said third PNP transistor, said second external terminal is connected to a collector of said third NPN transistor, a third input signal terminal on said integrated circuit is coupled to a base of said third PNP transistor, and a third output signal terminal on said integrated circuit is connected to an emitter of said third NPN transistor.

6. The output circuit as set forth in claim 5, wherein said integrated circuit comprises a fourth circuit, which has a collector of a fourth PNP transistor connected to a base of a fourth NPN transistor, said first external terminal is connected to an emitter of said fourth PNP transistor, said second external terminal is connected to a collector of said fourth NPN transistor, a fourth input signal terminal on said integrated circuit is coupled to a base of said fourth PNP transistor, and a fourth output signal terminal on said integrated circuit is connected to an emitter of said fourth NPN transistor.

7. The output circuit as set forth in claim 6, wherein said integrated circuit comprises a fifth circuit, which has a collector of a fifth PNP transistor connected to a base of a fifth NPN transistor, said first external terminal is connected to an emitter of said fifth PNP transistor, said second external terminal is connected to a collector of said fifth NPN transistor, a fifth input signal terminal on said integrated circuit is coupled to a base of said fifth PNP transistor, and a fifth output signal terminal on said integrated circuit is connected to an emitter of said fifth NPN transistor.

8. The output circuit as set forth in claim 7, wherein said integrated circuit comprises a sixth circuit, which has a collector of a sixth PNP transistor connected to a base of a sixth NPN transistor, said first external terminal is connected to an emitter of said sixth PNP transistor, said second external terminal is connected to a collector of said sixth NPN transistor, a sixth input signal terminal on said integrated circuit is coupled to a base of said sixth PNP transistor, and a sixth output signal terminal on said integrated circuit is connected to an emitter of said sixth NPN transistor.

9. The output circuit as set forth in claim 8, wherein said integrated circuit comprises a seventh circuit, which has a collector of a seventh PNP transistor connected to a base of a seventh NPN transistor, said first external terminal is connected to an emitter of said seventh PNP transistor, said second external terminal is connected to a collector of said seventh NPN transistor, a seventh input signal terminal on said integrated circuit is coupled to a base of said seventh PNP transistor, and a seventh output signal terminal on said integrated circuit is connected to an emitter of said seventh NPN transistor.

10. The output circuit as set forth in claim 9, wherein said integrated circuit comprises an eighth circuit, which has a collector of an eighth PNP transistor connected to a base of an eighth NPN transistor, said first external terminal is connected to an emitter of said eighth PNP transistor, said second external is connected to a collector of said eighth NPN transistor, and eighth input signal terminal on said integrated circuit is coupled to a base of said eighth PNP transistor, and an eighth output signal terminal on said integrated circuit is connected to an emitter of said eighth NPN transistor.

11. An output circuit comprising:
an integrated circuit including a first part and a second part, said first part having eight PNP transistors and eight NPN transistors where each PNP transistor has a collector connected to a base of one of said eight NPN transistors, and said second part has eight PNP transistors and eight NPN transistors where each PNP transistor has a collector connected to a base of one of each of said eight NPN transistors;
a first external terminal on said integrated circuit, which is connected to a voltage source, and is connected to emitters of said eight PNP transistors of said first part and to emitters of said eight PNP transistors of said second part;
a second external terminal on said integrated circuit which is connected to collectors of said eight PNP transistors of first part together;
a third external on said integrated circuit which is connected to collectors of said eight PNP transistors of sa second part together;
sixteen input signal terminals, one of said input signal terminals being coupled to a base of one of said PNP transistors;
sixteen output signal terminals, one of said output signal terminals being connected to an emitter of one of said PNP transistors;
a first voltage dropping means provided outside of said integrated circuit, which is connected to said first external terminal and to said second external terminal, for providing an electric potential to said second external terminal which is less than that supplied to said first external terminal; and
a second voltage dropping means provided outside of said integrated circuit, which is connected to said first external terminal and to said third external terminal, for providing an electrical potential to said third external terminal which is less than that supplied to said first external terminal.

12. The output circuit as set forth in claim 11, wherein said first voltage dropping means comprises a diode, which has an anode connected to said first external terminal and a cathode connected to said second external terminal, and said second voltage dropping means comprises a diode, which has an anode connected to said first external terminal and a cathode connected to said third external terminal.

13. The output circuit as set forth in claim 11, wherein said first voltage dropping means comprises a resistor, which has a first end connector to said first external terminal and a second end connector to said second external terminal, and said second voltage dropping means comprises a resistor, which has a first end connected to said first external terminal and a second end connector to said third external terminal.

14. The output circuit as set forth in claim 11, wherein voltage dropping means comprises a transistor, which has a collector and a base connected to said first external terminal and an emitter connector to said second external terminal, and said second voltage dropping means comprises a transistor, which has a collector and a base connected to said first external terminal and an emitter connected to said third external terminal.

* * * * *